United States Patent [19]

Graham

[11] Patent Number: 4,772,760
[45] Date of Patent: Sep. 20, 1988

[54] NONORTHOGONAL EMP SHIELDING ELEMENTS

[75] Inventor: Charles R. Graham, Glenshaw, Pa.
[73] Assignee: PPG Industries, Inc., Pittsburgh, Pa.
[21] Appl. No.: 43,919
[22] Filed: Apr. 28, 1987
[51] Int. Cl.$^4$ .............................................. H05K 9/00
[52] U.S. Cl. .................................................. 174/35 R
[58] Field of Search ..................... 174/35 R, 35 MS; 219/10.55 D; 361/424; 358/245; 455/300, 301

[56] References Cited

U.S. PATENT DOCUMENTS

| | | | |
|---|---|---|---|
| 3,703,450 | 11/1972 | Bakewell | 204/11 |
| 3,833,482 | 9/1974 | Jacobus | 204/11 |
| 3,878,061 | 4/1975 | Feldstein | 204/11 |
| 4,549,939 | 10/1985 | Kenworthy et al. | 204/4 |

OTHER PUBLICATIONS

A New and Unique Element for Aircraft Transparencies, Jan. B. Olson et al.

Primary Examiner—Arthur T. Grimley
Assistant Examiner—David A. Tone
Attorney, Agent, or Firm—Donna L. Seidel

[57] ABSTRACT

Nonorthogonal grid patterns and curved transparencies having nonorthogonal grid patterns comprising a matrix of interconnected circles and arcs are described for use as electromagnetic pulse shielding elements which diminish "starburst" light interference distortions and readily conform to compound curvatures and complex shapes.

20 Claims, 4 Drawing Sheets

APERTURE / PENETRATION TESTER

EMP SHIELDING EFFECTIVENESS
VS FREQUENCY

NONORTHOGONAL EMP SHIELDING ELEMENTS

BACKGROUND

The present invention relates generally to the art of electroforming, and more particularly to the art of electroforming a grid which provides shielding from electromagnetic pulse (EMP) effects.

Electroforming of precision patterns, such as those used in optical systems, has been accomplished by several methods. For example, precision mesh patterns have been produced by electroplating onto a master pattern of lines formed by etching or ruling lines into a glass substrate and depositing a conductive material into the etched or ruled lines to form a conductive master pattern for electroplating. A major disadvantage of this method is the limitation on the fineness and precision of etching glass.

Photolithographic techniques have also been used to produce patterned electroforming mandrels. For example, a conductive substrate, such as a polished stainless steel plate, is coated with a layer of photoresist. A patterned photomask is placed over the photoresist, which is then exposed to actinic radiation through the mask, thereby creating a pattern of exposed and unexposed photoresist which is further developed. Either the exposed or the unexposed portions of the photoresist are removed, depending on whether a positive or negative pattern is desired, resulting in a conductive pattern on the substrate. An electroplating process is then carried out to form a replica of the conductive pattern which can thereafter be removed from the substrate.

U.S. Pat. No. 3,703,450 to Bakewell discloses a method of fabricating precision conductive mesh pattern on a repetitively reusable master plate comprising a conductive pattern formed on a nonconductive substrate and a nonconductive pattern formed in the interstices of the conductive pattern. A reproduction of the master pattern is formed by plating of a conductive pattern onto the master pattern within a matrix defined by the nonconductive pattern. The conductive metal master pattern is typically deposited onto a glass plate by evaporation of a metal such as chromium through a ruled pattern formed on a stencil material. The nonconductive pattern is formed by depositing a layer of photoresist over the conductive pattern coated side of the glass plate. By exposing the photoresist to actinic radiation through the conductive pattern coated substrate, exact registration of the conductive and nonconductive patterns is achieved. The photoresist layer is developed and the exposed portions are removed, leaving a pattern of photoresist over the conductive pattern. A silicon monoxide layer is then deposited over the entire surface of the glass plate, covering both the photoresist/conductive pattern coated portions and the exposed glass portions. Finally, the photoresist overlying the conductive pattern and the silicon monoxide overlying the residual photoresist material are removed, leaving the glass plate coated with a conductive metal pattern and an array of silicon monoxide deposits in the interstitial spaces in the conductive pattern. Replicas of the conductive pattern are then formed by electroplating.

U.S. Pat. No. 3,833,482 to Jacobus discloses a matrix for the formation of fine mesh comprising a base plate, a photoresist defining the mesh pattern, and a silica coating encapsulating the top of the base plate and the photoresist. A layer of electrically conductive metal is sputtered over the entire surface of the matrix, followed by removal of the conductive metal from the top surface of the resist on the matrix. The matrix is then suitable for electroforming on the layer of conductive metal located in the recess of the matrix.

U.S. Pat. No. 3,878,061 to Feldstein discloses a matrix comprising a highly polished, degenerately doped silicon single crystal substrate having a layer of inorganic dielectric thereon and a pattern of grooves in the dielectric coating exposing the silicon surface.

"A New and Unique Element for Aircraft Transparencies" by Olson et al from the *Conference on Aerospace Transparent Materials and Enclosures*, December 1983, describes an element comprised of myriad thin filaments prepared by a photolithographic/chemical processing method which involves generating a master pattern, producing a photomask of the pattern, applying a conductive metal layer over a substrate, coating the metal layer with photoresist, exposing the photoresist through the photomask, developing the photoresist, and placing the substrate in an etchant to remove the unwanted material leaving only the desired pattern, which functions as a heating element.

Grids for EMP and microwave attenuation have been used in special purpose aircraft transparencies for a number of years, since it is imperative that electronic systems essential to national security function properly during and after exposure to a nuclear environment. A characteristic of the hostile nuclear environment is the multiplicity of destructive mechanisms; an electromagnetic pulse (EMP) is only one of many products of a nuclear detonation. During a nuclear event, the gamma rays from the burst collide with air molecules in the atmosphere creating Compton electrons which move rapidly away from the center of the burst. This large-scale separation of charges creates a strong nonradiated electric field between the electrons and the parent ions. The movement of these charges produces a Compton current. Most of the EMP energy lies between 10 kHz and 100 mHz, and the pulse is characterized by electromagnetic fields with short rise times (a few nanoseconds) and a high peak electric field amplitude (50 kilovolts per meter). A critical property of EMP is its devastating range; if a high-yield EMP weapon is detonated above the atmosphere, EMP has the capability of disabling electric and electronic systems as far as several thousand miles from the detonation site. EMP grids fabricated by chemical machining have been acceptable for attenuating EMP. However, such coarse-line orthogonal patterns have been nonuniform, especially in cross-section. A fine-line orthogonal grid fabricated by an electroforming process in accordance with the present invention has improved optics and shielding characteristics with a uniform nearly square cross-section.

Electrically, small apertures on an electromagnetic shield are best characterized in terms of magnetic and electric field polarizabilities. An electrically small aperture can be defined as having dimensions significantly less than a wavelength at the highest frequency of interest. In the case of EMP, this frequency is on the order of 100 mHz, corresponding to a wavelength of three meters. Thus, apertures of about one-half meter could be considered reasonably small. Since a typical aircraft transparency has dimensions on this order, the application of a grid to the transparency can provide EMP shielding without substantially compromising visibility.

Polarizabilities of an aperture are the quantities which relate the external incident fields to the equivalent dipole moments for the electric and magnetic fields inside the aperture. Since the polarizabilities depend only on the size and shape of the aperture, they can be used to define a complete electromagnetic description of the aperture. The polarizabilities are found to vary as the cube of the aperture diameter. The term "normalized polarizabilities" is used to describe the attenuation effect of placing a thin film or metallic grid over an aperture. Normalized polarizability, $a_n$, is defined as the ratio of the polarizability of the shielded aperture, a, to the polarizability of the open aperture, $a_o$. The "shielding effectiveness" of an EMP shielded transparency is directly dependent on the normalized polarizability as shown in the following equation:

$$20 \log(a/a_o) = 20 \log a_n.$$

Since the electroforming method of the present invention produces finer lines of more uniform cross-section, a greater grid density is possible, i.e., more apertures in a given surface area. Since dividing an aperture into N apertures reduces the penetration field by 1/N, the shielding effectiveness is improved by increasing the grid density with the finer grid lines provided by the method of the present invention. Moreover, the nonorthogonal grid patterns of the present invention provide improved optical properties and greater physical flexibility to conform to compound curves and complex shapes.

SUMMMARY OF THE INVENTION

The present invention provides superior, nonorthogonal patterns for producing a grid which provides electromagnetic pulse (EMP) shielding. The nonorthogonal patterns of the present invention provide equivalent shielding effectiveness to that provided by orthogonal grids of the prior art while improving the optical performance by reducing diffraction interference patterns ("starburst"). In addition, the nonorthogonal patterns of the present invention are readily conformable to compound curved and complex shaped substrates.

DETAILED DESCRIPTION OF THE PREFERRED EMBODIMENTS

Figure 1:
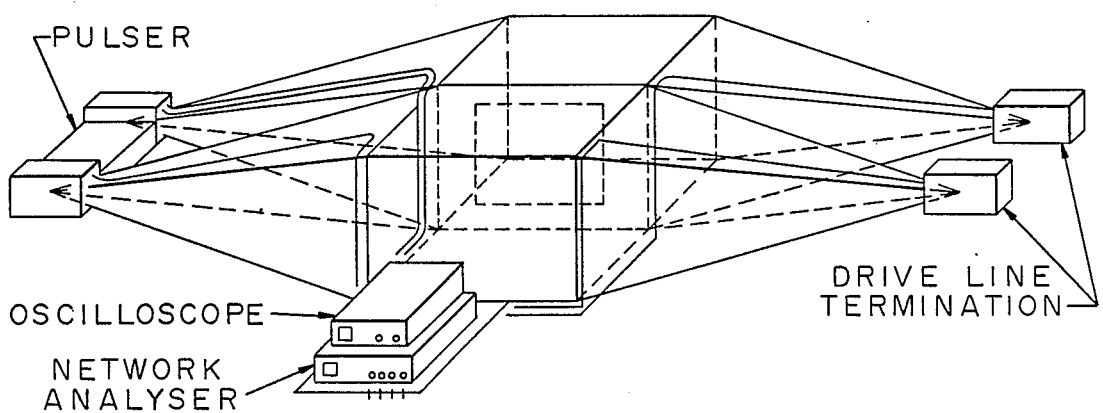
FIG. 1 illustrates the apparatus used to measure normalized polarizabilities of EMP shielding grids of the present invention.

A highly conductive metallic grid pattern laminated in an aircraft transparency must demonstrate excellent optical properties as well as effective EMP shielding for the electronic equipment. A fine-line orthogonal grid pattern, although an effective EMP shielding design, introduces an objectionable optical distortion problem for the crew, especially under night vision conditions. Fraunhofer diffraction interference patterns produced by the square apertures of the grid pattern cause a "starburst" visual effect from incident light. The fine-line nonorthogonal grid patterns of the present invention are designed with a continuous series of interconnected closed loop apertures, particularly circles interconnected by arcs, preferably pairs of arcs. The Fraunhofer diffraction interference pattern produced by circular apertures is diffusely circular and not as severe a visual disturbance as the "starburst" pattern of an orthogonal grid.

In addition, an orthogonal grid which has sufficient physical flexibility to conform to a simple curve such as a cylindrical surface does not have sufficient degrees of freedom to conform to compound curvatures or complex shapes without wrinkling or buckling. For an orthogonal grid, the mechanical characteristics and limitations are similar to those of a thin flat sheet. When an orthogonal grid is to be used for EMP shielding of aircraft window transparencies which have compound curvature shapes, the grid wrinkles or buckles when laminated with a transparent substrate. In such applications, a grid must adhere to rigid physical dimensions with very limited tolerances in order to properly function as an EMP shield. The nonorthogonal grid patterns of the present invention modify the mechanical characteristics from those of a thin flat sheet by replacing equally spaced square grids with a network of closed loops, preferably circles, interconnected by arcs, preferably in pairs, in a uniform pattern which readily conforms to compound curves and complex shapes.

In a preferred embodiment of the invention, a nonorthogonal grid pattern comprises a network of evenly spaced circles, all having the same radius. The circles define the nodes of the network. From center to center, the spacing between adjacent circles is preferably three times the radius. The circles are preferably connected by pairs of arcs, the relative size of the circles and length of the arc segments being defined in proportion to the radius of the circle. Thus, by modifying the radius of the circles without changing the spacing of the nodes, several variations of a pattern can be defined having different degrees of flexibility, achieved by the size an shape of the circular nodes and arcs.

In order for a nonorthogonal grid pattern to conform to a compound curvature, the lateral flexibility of the node must allow for simultaneous compression in one direction and stretching at 90° from the direction of the compression force. Also, the interconnecting arcs must allow for compression forces or stretching forces between the nodes. With the nonorthogonal patterns of the present invention, the circular nodes allow for simultaneous compression in one direction and stretching in a perpendicular direction by distorting to an ellipse, while the arc shaped paths allow for compression and/or stretching between nodes. Patterns with straight line segments do not have sufficient flexibility to allow for incremental distortion, and thus translate the bending forces to adjacent segments. This type of mechanical force translation results in a structure with undesirable wrinkling or buckling. The nonorthogonal grid patterns of the present invention allow for small incremental changes in shape of individual segments such that the overall pattern can conform to a required shape to fit a compound curved or complex shaped substrate.

With the nonorthogonal grid patterns of the present invention, lamination processes or molding procedures are accomplished with reasonably uniform shaping forces because the deformation of each of the affected nodes is very small, and the overall nonorthogonal grid conforms to the curvature and shape of the substrate with minimal wrinkling. The nonorthogonal grid patterns illustrated in FIGS. 3 and 4 demonstrate a substantial increase in flexibility and conformability compared with a standard square grid pattern.

Another problem with conventional square grid patterns is related to the optical conditions for visibility during night landings; landing lights are observed by the pilot as distracting "starburst" patterns. This "starburst" effect is caused by the diffraction of light transmitted through a square or rectangular aperture of a conventional grid pattern which produces this type of interference effect. Since the diffraction interference pattern produced by a circular aperture is an Airy diffraction interference pattern which is basically circular in nature, the "starburst" problem will be reduced or eliminated by the nonorthogonal patterns of the present invention.

The nonorthogonal patterns of the present invention may be produced by the same procedures and processes used to produce conventional flat square EMP grids; the only difference is in the artwork pattern. A preferred electroforming method is described in U.S. Ser. No. 43,918 entitled "Electroforming EMP Shielding Elements" filed Apr. 28, 1987, the disclosure of which is incorporated herein by reference.

A mathematical algorithm can be defined using trigonometric functions to prepare a computer assisted design (CAD) program to generate plot commands for a high precision photoplotter. The film generated by the photoplotter contains the pattern image, becoming the artwork used to produce a photomask, which is used to reproduce the nonorthogonal pattern on a mandrel, which in turn is used in an electroforming process to produce a nonorthogonal grid.

A basic algorithm used to generate the network pattern previously described for an EMP shielding pattern is defined as an evenly spaced matrix of equal sized circles aligned in rows and columns. The size of the circles and the spacing between them are defined in terms of the radius of a circle $R_1$. The spacing from center to center in both horizontal rows and vertical columns is preferably three times $R_1$, where $R_1$ may also be the radius of the circles, $R_3$. The nodes of the matrix are the previously described circles. The spacing of the nodes ($3 \times R_1$) can be maintained constant while the radius of the circles ($R_3$) is increased or decreased to alter the flexibility of the grid. Similarly the radius of curvature of the arcs can be changed, as well as the spacing between nodes.

Figure 5:
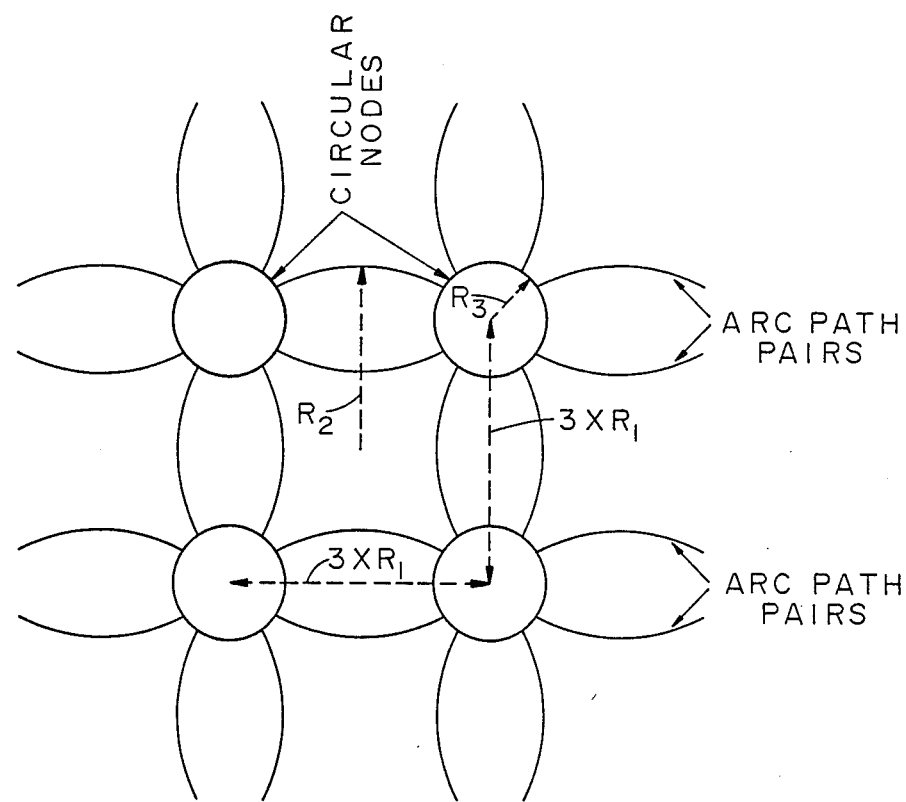
FIG. 5 illustrates a 2×2 matrix of circular nodes and the origin of the interconnecting arcs.

To illustrate the orientation of the arcs that interconnect the nodes, FIG. 5 illustrates four adjacent nodes which form a $2 \times 2$ matrix. The center point for the arcs is located equally distant from each of the four nodes, such that a circle of radius $R_2$ passing through the center of each of the four circles of radius $R_3$ forms one arc of each pair. By relocating the origin of the arc radius to the next adjacent $2 \times 2$ node matrix such that two of the nodes are in an adjacent $2 \times 2$ matrix, the four arcs formed by a second circle of radius $R_2$ in this $2 \times 2$ matrix will complete pairs of arcs in the adjacent matrices. In each case, the circles of the nodes and the interconnecting arcs form nonorthogonal intersections.

In a preferred embodiment of the present invention, a photomask master plate is provided with a nonorthogonal artwork pattern generated as described above representing a desired configuration for an EMP shielding grid to be produced by electroforming. A substrate with a conductive surface is used as an electroforming mandrel, preferably a sheet of nickel or stainless steel. A continuous layer of photoresist is applied over the conductive surface of the mandrel. Any conventional photoresist with sufficient resolution is acceptable.

In a preferred embodiment of the present invention, photoresist in sheet form is laminated to the conductive surface of the mandrel. The photoresist is exposed to actinic radiation through the photomask to cure the exposed portions of the photoresist. The photomask pattern masks portions of the photoresist from exposure, and these portions remain uncured. Following exposure of the photoresist, and a post-curing cycle if necessary, the photoresist is developed.

Preferably, the photoresist is contacted with a chemical solution which dissolves and removes the unexposed, uncured portions of the photoresist, thereby providing a pattern of the underlying conductive film which is a positive image of the pattern in the photomask. The remaining exposed, cured portions of the photoresist surrounding the conductive pattern form walls within which the nonorthogonal electroformed grid is subsequently deposited. In an alternative embodiment of the present invention, a positive working photoresist may be employed to form a conductive film pattern which is a negative image of the photomask pattern.

The resulting article is employed as a mandrel for the electroforming of a nonorthogonal EMP shielding grid, which is a replication of the nonorthogonal pattern on the conductive surface of the mandrel. In accordance with the present invention, the exposed metal pattern on the mandrel surface is treated to produce a slightly oxidized surface which facilitates subsequent release of the nonorthogonal electroformed grid mandrel.

The back side of the mandrel is covered with a nonconductive material to prevent deposition of metal except on the pattern. Then the mandrel is immersed in a metal-containing electrodeposition solution. Preferred electroforming solutions comprise nickel or copper salts, preferably nickel sulfamate or copper sulfate. An electrical circuit is established, using the conductive mandrel surface as the cathode and an electrode of the metal to be deposited as the anode. Preferred anodes comprise nickel or copper. An electrical potential is applied, and metal is deposited on the conductive exposed mandrel surface in the pattern as defined by the nonconductive photoresist. Electrodeposition is continued until the desired thickness is obtained for the nonorthogonal electroformed EMP shielding grid.

The substrate bearing the photoresist and nonorthogonal electroformed EMP shielding grid is removed from the electrodeposition solution. Separation of the nonorthogonal electroformed EMP shielding grid from the mandrel may be effected by various means, such as alternately heating and chilling. In certain applications wherein the nonorthogonal electroformed EMP shielding grid is very thin and/or comprises very fine lines, the remaining photoresist is first removed, preferably by dissolution. Then the nonorthogonal electroformed grid is lifted off the mandrel. In most preferred embodiments of the present invention, wherein the nonorthogonal electroformed EMP shielding grid comprises very fine lines, a preferred method for separating the electroformed heating element from the mandrel is to remove the photoresist and carefully lift the nonorthogonal electroformed grid off the mandrel surface.

In a preferred embodiment of the present invention, a photomask is prepared by coating a plate with a photographic emulsion comprising silver halide which is exposed to actinic radiation through a master pattern in the shape of the grid to be electroformed. Exposed areas of the photographic emulsion form a latent image which is developed by immersion in developing solutions which convert the silver halide to colloidal silver.

An electroforming mandrel is preferably prepared by cleaning a surface of a stainless steel substrate. A continuous layer of photoresist is applied over the conductive surface of the sheet preferably by laminating a sheet of photoresist to the surface, e.g. at a temperature of 235° F. (about 113° C.). A preferred photoresist layer having a thickness of 0.001 inch (about 0.025 millimeter) is available from Thiokol/Dynachem Corporation of Tustin, Calif. The photoresist is preferably exposed to actinic radiation through the photomask for about 20 seconds and cured. The photoresist is developed with a solvent which removes the unexposed portions of the photoresist thereby providing a conductive pattern on the underlying stainless steel mandrel surface. The resultant electroforming mandrel is preferably treated to form a slightly oxidized surface on the exposed metal pattern, preferably by contact with a strong acid, in order to facilitate subsequent release of the electroformed grid.

The stainless steel mandrel is immersed in an electroforming solution preferably comprising copper sulfate and utilizing a copper anode in order to electroform a highly conductive copper nonorthogonal grid which provides substantial EMP shielding when applied to a transparency, while minimizing optical disruptions such as "starburst" patterns. The nonorthogonal configuration of the grids of the present invention permit lamination in compound curvatures and complex shapes without wrinkling or buckling. The nonorthogonal grids of the present invention are preferably laminated in transparencies comprising layers of glass or rigid transparent plastics such as polycarbonate and acrylic, and preferably further comprising an elastomeric layer such as polyvinyl butyral and polyurethanes. Such laminates are particularly useful as aircraft windshields.

The present invention will be further understood from the descriptions of specific examples which follow.

EXAMPLE I

Figure 3:
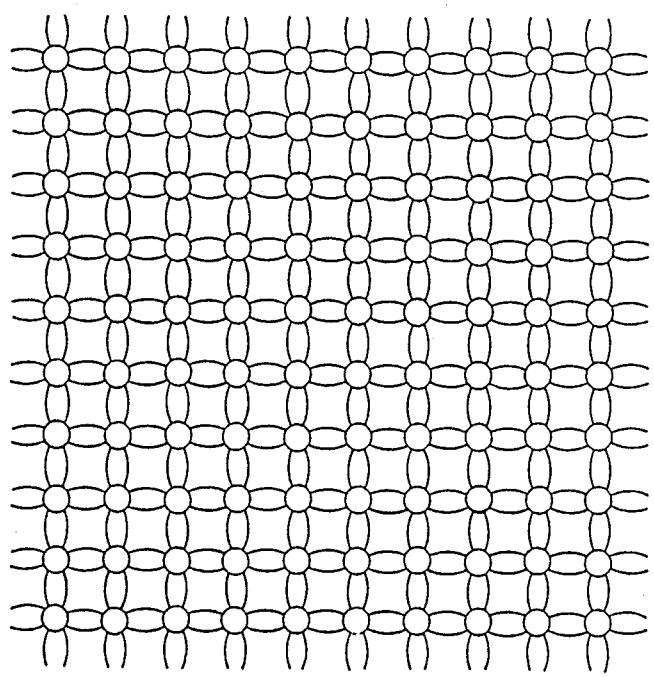
FIG. 3 illustrates a pattern of circles interconnected by pairs of arcs having the dimensions described in Example I.

A nonorthogonal grid as shown in FIG. 3 is designed with the following dimensions: $R_1=0.033$ inch (0.84 millimeter), $R_2=0.071$ inch (1.8 millimeter) and $R_3=0.025$ inch (0.635 millimeter), wherein $R_1$ is the radius of a circle which defines the spacing of the matrix (the space between nodes equals three times $R_1$), $R_2$ is the radius of curvature of the interconnecting arcs and $R_3$ is the radius of the interconnected circles. Photoplotted artwork is used to produce a photomask, which is used to reproduce the nonorthogonal pattern onto a mandrel for electroforming a nonorthogonal grid of the same pattern.

A stainless steel mandrel measuring 24 by 36 inches (about 0.61 by 0.91 meters) is degreased, roughened and cleaned with detergent and hydrochloric acid. A sheet of negative-working dry photoresist 0.0015 inch (about 0.038 millimeter) thick is laminated to a surface of the mandrel. An imaged photomask having a nonorthogonal EMP grid pattern as illustrated in FIG. 3 is placed in contact with the photoresist-coated mandrel surface. The photomask/mandrel stack is placed in an ultraviolet radiation exposure chamber to activate the photoresist, producing a negative image. The photoresist is developed, removing the exposed portion to yield a conductive pattern on the mandrel surface. The patterned mandrel is heated for 30 minutes at 250° F. (about 121° C.) to improve the adhesion of the photoresist.

After cooling, the back side of the mandrel, i.e. opposite the photoresist pattern coated side, is covered with a nonconductive material to prevent electrodeposition of metal onto the back surface. The mandrel is further cleaned by dipping in 10 percent hydrochloric acid for 30 seconds and rinsing. A preferred reverse polarity cleaning procedure is carried out by immersing the mandrel in an alkaline cleaning solution and applying a current of 2 amps for a period of 2 minutes with the mandrel functioning as the anode in order to form an oxidized surface on the conductive metal pattern which facilitates subsequent release of the electroformed grid. Following the reverse polarity cleaning, the mandrel is immersed in 5 percent nitric acid for 15 minutes and then rinsed.

Finally, the mandrel is immersed in an electroforming solution containing vertically oriented anodes of at least the same surface area as the mandrel. An electrical potential is applied between the anodes and the mandrel, which functions as the cathode. Metal atoms from the anode enter the solution as ions, while ions from the solution deposit as metal on the cathode, i.e. the conductive mandrel surface. The electroforming solution comprises copper sulfate, so that metallic copper forms in the nonorthogonal pattern of the photoresist on the mandrel surface. The electroforming reaction is continued until the desired copper thickness is obtained. In this example, with a photoresist thickness of 0.0015 inch (about 0.038 millimeter) and a line width of 0.0017 inch (about 0.043 millimeter), the electroforming reaction is continued to a copper thickness of about 0.0017 inch (about 0.043 millimeter), resulting in a maximum line width of about 0.0021 inch (about 0.054 millimeter).

To remove the nonorthogonal electroformed grid from the mandrel, the coated mandrel is placed in a bath containing solvent, preferably heated to about 130° F. (about 54° C.), which removes the photoresist from the mandrel surface. The nonorthogonal electroforming grid is then lifted from the mandrel surface for subsequent lamination in a transparency.

EXAMPLE II

Figure 4:
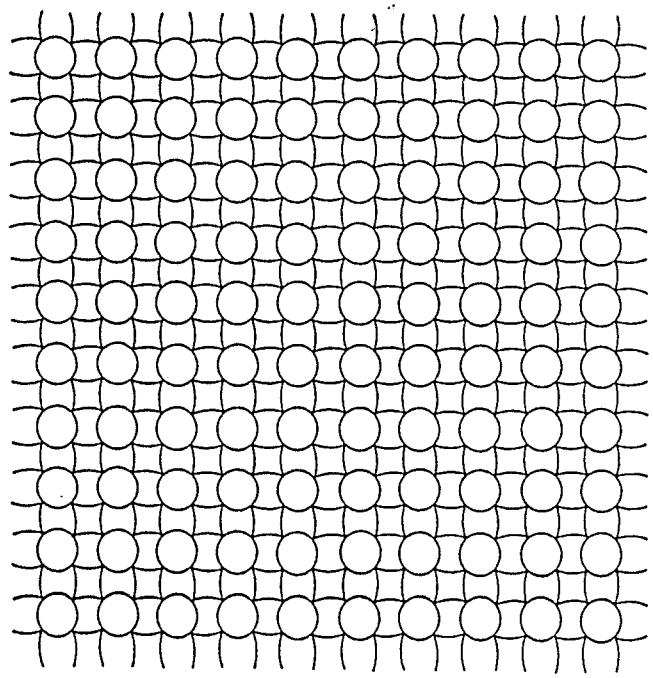
FIG. 4 illustrates a pattern of circles interconnected by pairs of arcs having the dimensions described in Example II.

A nonorthogonal pattern as shown in FIG. 4 is designed and produced as in Example I with the following dimensions: $R_1=0.033$ inch (0.84 millimeter), $R_2=0.078$ inch (1.98 millimeter) and $R_3=0.033$ inch (0.84 millimeter). The resistivity of the nonorthogonal grid pattern of this example is about 24 milliohms per square.

The normalized polarizabilities of the nonorthogonal electroformed grids of Examples I and II are measured in a DNA/JAYCOR dual transverse electromagnetic wave (TEM) cell in which the electric field is normal and the magnetic field is parallel to the test material. The dual TEM cell is chosen over most other EMP testing equipment since the results calculated are both E field (electrical) and H field (magnetic) shielding effectiveness. The results of most other EMP evaluation systems are given as free field attenuation so that the specific E field and H field attenuation cannot be obtained. The dual TEM cell used in this investigation consists of a pair of Crawford cells with a common wall between them in which the device to be tested is placed.

FIG. 1 illustrates the DNA/JAYCOR dual TEM cell. In this system, one cell is driven and the other is used as a sensor for penetration through the aperture. The two ports of the driven line are connected to a source and a load. The two ports of the sensor line are connected to receivers that measure the two responses. One is the sum of the magnetic and electric polarizabilities. To obtain a normalized polarizability, the evaluation includes background or noise level tests with and without a solid metallic shield within the aperture, tests of the unshielded aperture and tests with the EMP shielded sample in place.

Figure 2:
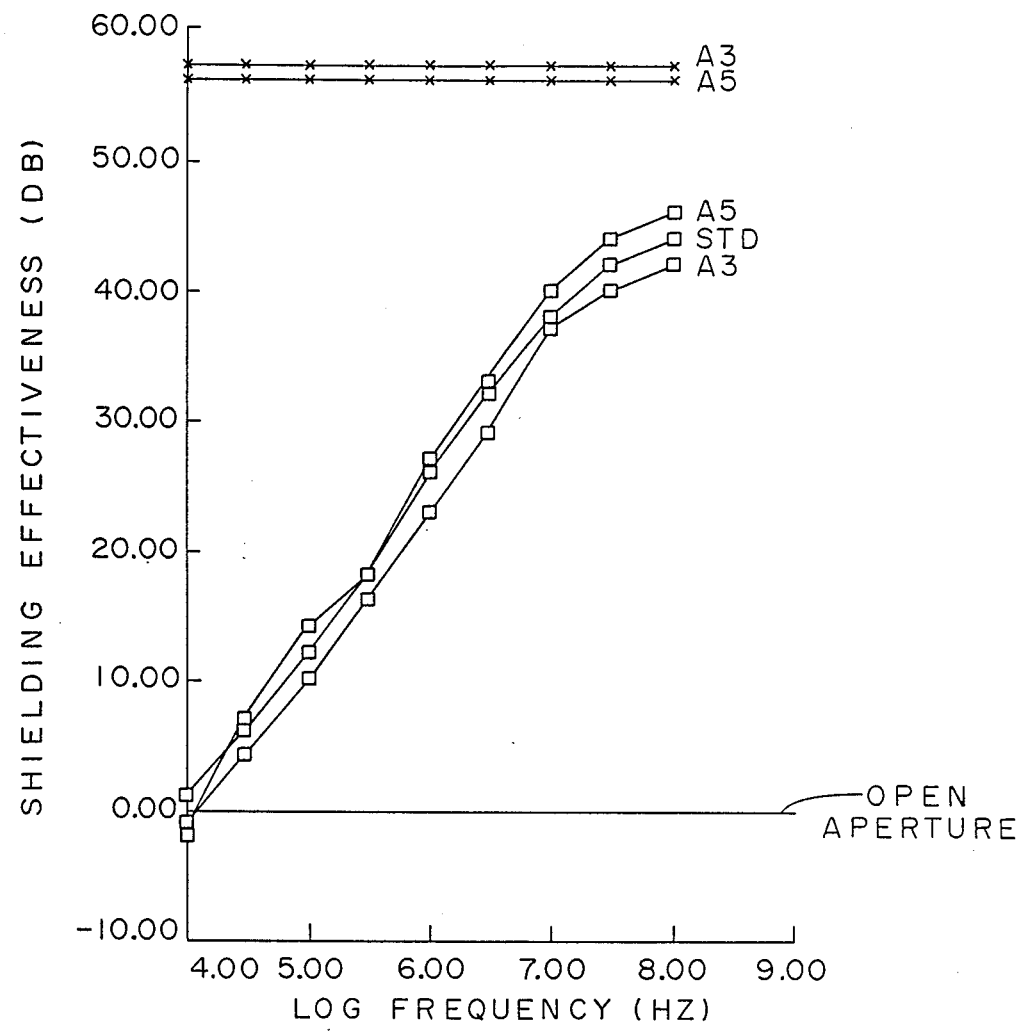
FIG. 2 compares the shielding effectiveness of nonorthogonal EMP shielding grids (A3 and A5) of the present invention with that of an orthogonal grid (S&D) of the prior art. The E field (electrical) shielding is shown at the top of FIG. 2, and the H field (magnetic) shielding effectiveness is shown at the bottom.

Special attention is placed on maximizing the electrical contact to the edge attachments, since inadequate contact degrades the experimental results. As a preliminary test, the contact impedance is varied from 100 milliohms to 0.01 milliohm to determine its effect on the measured normalized polarizabilities. It is determined that the contact resistance for 12"×12" sample size is required to be less than 0.1 milliohm. Below 0.1 milliohm, the performance is limited only by the grid characteristics. Thus, samples are carefully placed in the test chamber to insure that the contact impedance is less than 0.1 milliohm. The results of these tests are shown in FIG. 2, comparing the shielding effectiveness of the nonorthogonal electroformed grid patterns of Examples I and II (A3 and A5 respectively) of the present invention with an orthogonal electroformed grid (STD) of the prior art.

The above examples are offered to illustrate the present invention. While electroforming is the preferred method for producing the nonorthogonal grid patterns of the present invention, the optical and flexibility improvements obtained with nonorthogonal grid patterns are not thereby limited. Although the nonorthogonal grid pattern of the present invention is described herein as useful for EMP shielding, it is not limited to such use. For example, higher resistance nonorthogonal metallic grids may be used as heating elements. The scope of the present invention is defined by the following claims.

I claim:

1. A transparent article comprising:
   (a) a transparent substrate; and
   (b) a nonorthogonal grid pattern on a surface of said substrate wherein said pattern comprises a series of closed loops, equally spaced and interconnected by arcs.

2. A transparent article according to claim 1, wherein said nonorthogonal grid pattern is a conductive metal.

3. A transparent article according to claim 2, wherein said conductive metal is selected from the group consisting of nickel and copper.

4. A transparent article according to claim 3, wherein said conductive metal is copper.

5. A transparent article according to claim 1, wherein said transparent substrate is selected from the group consisting of glass and rigid transparent plastics.

6. A transparent article according to claim 5, wherein said transparent substrate comprises a laminate comprising at least one layer of a rigid transparent plastic selected from the group consisting of polycarbonate and acrylic.

7. A transparent article according to claim 6, wherein said transparent substrate comprises a layer of transparent thermoplastic plastic.

8. A transparent article according to claim 7, wherein said thermoplastic layer is selected from the group consisting of polyvinyl butyral and polyurethanes.

9. A transparent article according to claim 5, wherein said transparent plastic is acrylic.

10. A transparent article according to claim 5, wherein said transparent plastic is polycarbonate.

11. A transparent article comprising:
    (a) a curved transparent substrate; and
    (b) a nonorthogonal grid patern on a surface of said substrate, wherein said pattern comprises a series of closed loops, equally spaced and interconnected by arcs.

12. A transparent article according to claim 11, wherein said nonorthogonal grid pattern is a conductive metal.

13. A transparent article according to claim 12, wherein said conductive metal is selected from the group consisting of nickel and copper.

14. A transparent article according to claim 13, wherein said conductive metal is copper.

15. A transparent article according to claim 11, wherein said transparent substrate is selected from the group consisting of glass and rigid transparent plastics.

16. A transparent article according to claim 15, wherein said transparent substrate comprises a laminate comprising at least one layer of a rigid transparent plastic selected from the group consisting of polycarbonate and acrylic.

17. A transparent article according to claim 16, wherein said transparent substrate comprises a layer of transparent thermoplastic plastic.

18. A transparent article according to claim 17, wherein said thermoplastic layer is selected from the group consisting of polyvinyl butyral and polyurethanes.

19. A transparent article according to claim 15, wherein said transparent plastic is acrylic.

20. A transparent article according to claim 15, wherein said transparent plastic is polycarbonate.

* * * * *